(12) United States Patent
Aoki et al.

(10) Patent No.: US 10,734,468 B2
(45) Date of Patent: Aug. 4, 2020

(54) DISPLAY DEVICE

(71) Applicant: Japan Display Inc., Minato-ku (JP)

(72) Inventors: Hayata Aoki, Minato-ku (JP); Masumi Nishimura, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/392,757

(22) Filed: Apr. 24, 2019

(65) Prior Publication Data

US 2019/0333979 A1 Oct. 31, 2019

(30) Foreign Application Priority Data

Apr. 27, 2018 (JP) ................. 2018-087790

(51) Int. Cl.
*H01L 27/32* (2006.01)
*H01L 51/00* (2006.01)

(52) U.S. Cl.
CPC ...... *H01L 27/3276* (2013.01); *H01L 51/0097* (2013.01)

(58) Field of Classification Search
CPC ................ H01L 27/3276; H01L 51/0097
See application file for complete search history.

(56) References Cited

U.S. PATENT DOCUMENTS

2016/0174304 A1  6/2016  Kim et al.
2017/0302772 A1  10/2017  Zhang et al.

*Primary Examiner* — Douglas M Menz
(74) *Attorney, Agent, or Firm* — Oblon, McClelland, Maier & Neustadt, L.L.P.

(57) ABSTRACT

A display device according to an embodiment of the present invention includes: a display area provided with a pixel array part; a terminal area arranged on a backside of the display area and provided with a connection terminal to which a signal is supplied from outside; and a bendable area to connect the display area and the terminal area, wherein the display device is provided with, in the bendable area, an under layer having flexibility, and a connection wiring which is provided on the under layer and extends from a side of the pixel array part to a side of the connection terminal, and an upper surface of the under layer has an uneven shape so that the connection wiring repeatedly turns in directions of a thickness of the under layer.

12 Claims, 20 Drawing Sheets

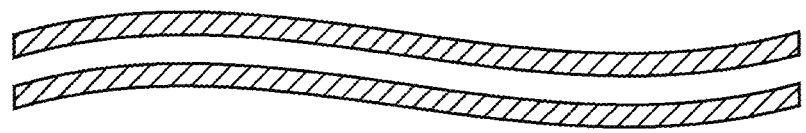
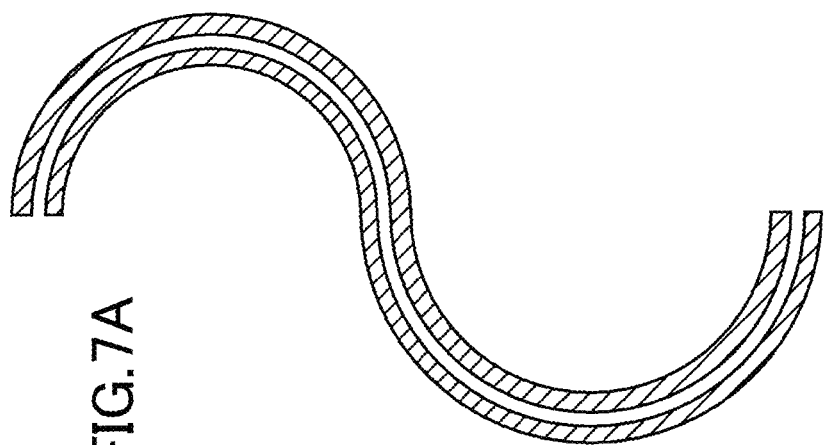

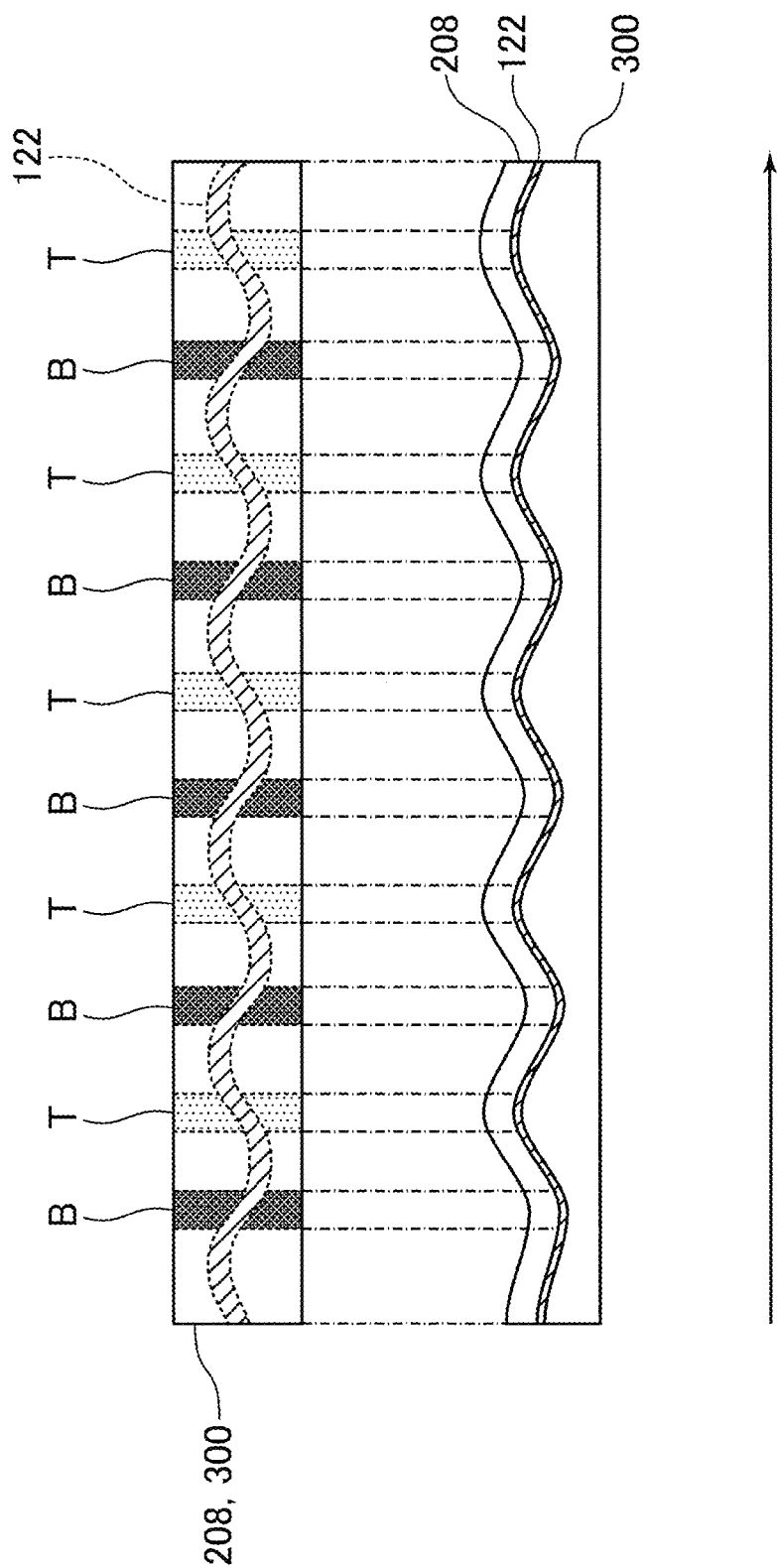

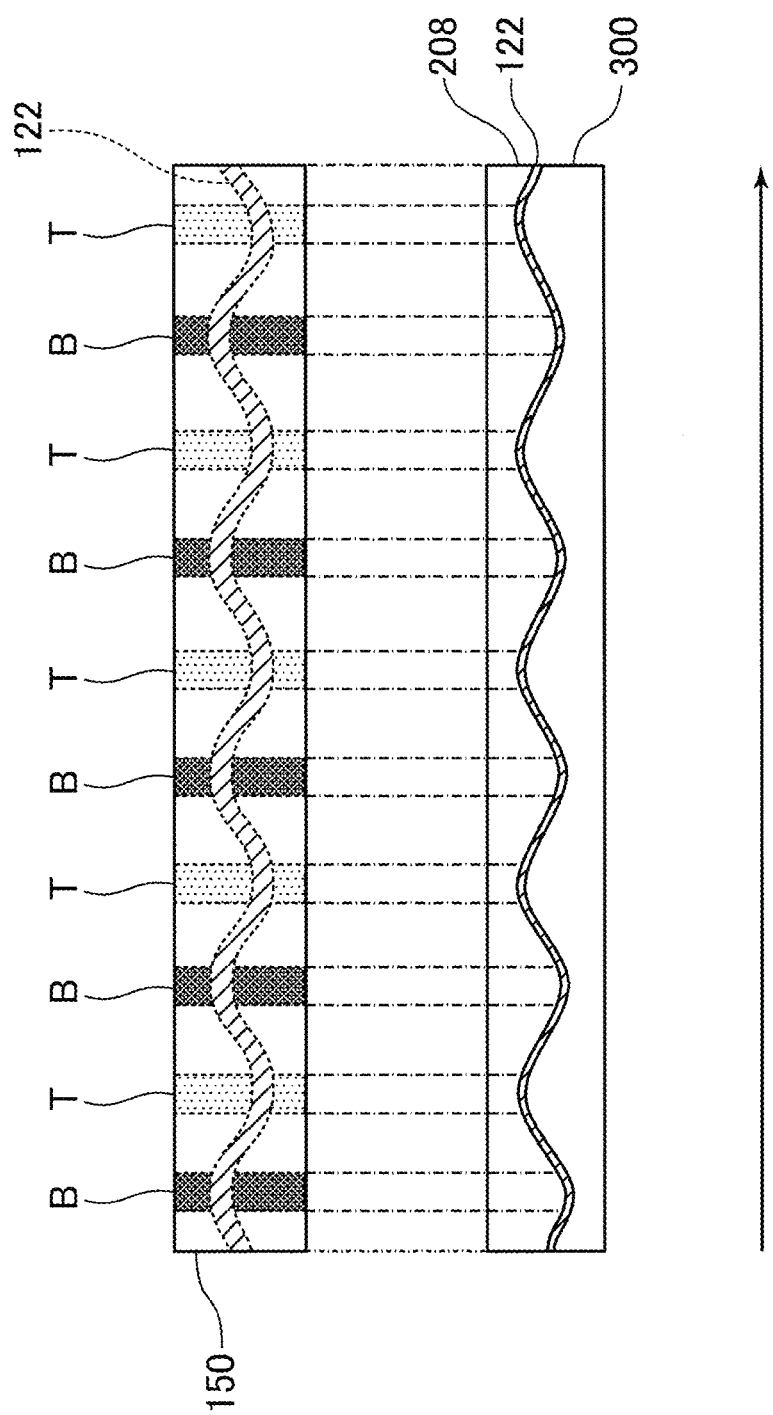

DISPLAY DEVICE

CROSS-REFERENCE TO RELATED APPLICATION

The present application claims priority from Japanese application JP2018-087790 filed on Apr. 27, 2018, the content of which is hereby incorporated by reference into this application.

BACKGROUND OF THE INVENTION

1. Field of the Invention

One or more embodiments of the present invention relate to a display device, and in particular, to a configuration of wiring of a display device.

2. Description of the Related Art

A flexible display device is developed which can narrow the frame by bending, to the backside of a display area, a mounting part of an integrated circuit (IC) and a flexible printed circuit (FPC) which are provided outside the display area of the display panel, in order to narrow a frame.

The specification of U.S. Unexamined Patent Application Publication No. 2016/0174304 and the specification of U.S. Unexamined Patent Application Publication No. 2017/0302772 disclose improving resistance with respect to bending by arranging a wiring provided on a to-be-bent area so that it looks non-linear in a plan view.

SUMMARY OF THE INVENTION

However, if a wiring which looks a non-linear in a plan view is provided, an area necessary for one wiring in a plan view increases. Therefore, as compared to the case where wirings are formed to be linear, an area necessary to provide the same number of wirings in a plan view increases.

The present invention has been made in view of the above problem, and the object thereof is to provide a display device which can reduce an area necessary to provide a wiring in a plan view while maintaining a desired resistance with respect to bending of the wiring.

A display device according to an embodiment of the present invention includes: a display area provided with a pixel array part; a terminal area arranged on a backside of the display area and provided with a connection terminal to which a signal is supplied from outside; and a bendable area to connect the display area and the terminal area, wherein the display device is provided with, in the bendable area, an under layer having flexibility, and a connection wiring which is provided on the under layer and extends from a side of the pixel array part to a side of the connection terminal, and an upper surface of the under layer has an uneven shape so that the connection wiring repeatedly turns in directions of a thickness of the under layer.

BRIEF DESCRIPTION OF THE DRAWINGS

FIG. 7A is a schematic view which illustrates a shape of a connection wiring layer.

FIG. 7B is a schematic view which illustrates a shape of the connection wiring layer.

FIG. 19 is an enlarged view which illustrates a structure of a bendable area according to an embodiment of the present invention.

FIG. 20 is an enlarged view which illustrates a structure of a bendable area according to an embodiment of the present invention.

DETAILED DESCRIPTION OF THE INVENTION

Figure 1:
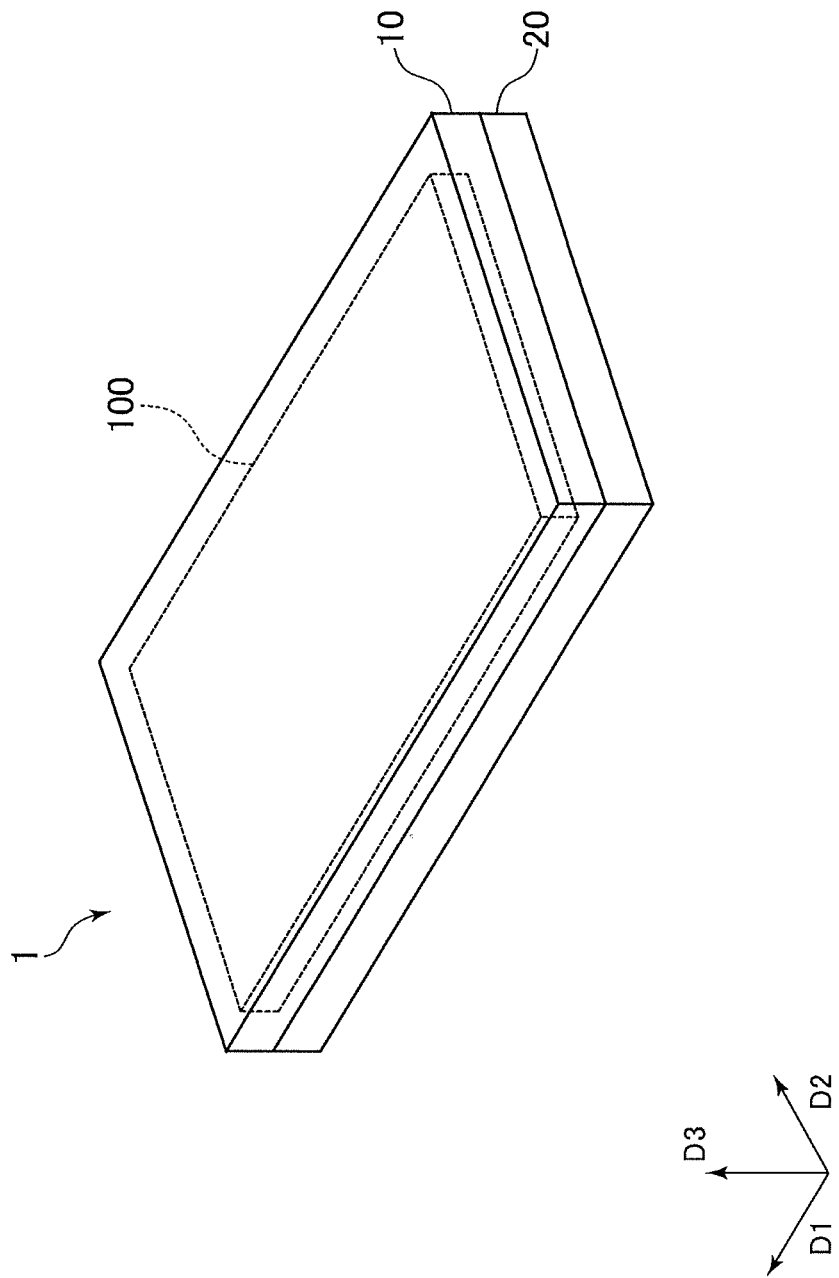
FIG. 1 is a schematic view of a display device according to an embodiment of the present invention.

Below, the respective embodiments of the present invention will be described, referring to the drawings. The disclosed embodiments are merely examples, and appropriate variations within the spirit of the present invention that can be easily arrived at by those skilled in the art are naturally included in the scope of the present invention. Further, while the width, thickness, shape, and the like of each part in the drawings may be illustrated schematically as compared with actual embodiments in order to clarify the explanation, these are merely examples and an interpretation of the present invention should not be limited thereto. Furthermore, in the specification and respective drawings, the same reference symbols may be applied to elements similar to those that have already been illustrated in another drawing and a detailed explanation of such elements may be omitted as appropriate.

Further, in the detailed description of the one or more embodiments of the invention, when a positional relationship between one component and another component is defined, the words "on" and "under" are not used only in a case where the other component is positioned directly on or under the one component, but those words are also used in a case where still another component is interposed between the one component and the other component, unless otherwise stated.

FIG. 1 is a schematic view of a display device 1 according to an embodiment of the present invention. As illustrated in the figure, the display device 1 is configured to include a display panel 100 held so as to be sandwiched by an upper frame 10 and a lower frame 20.

Figure 2:
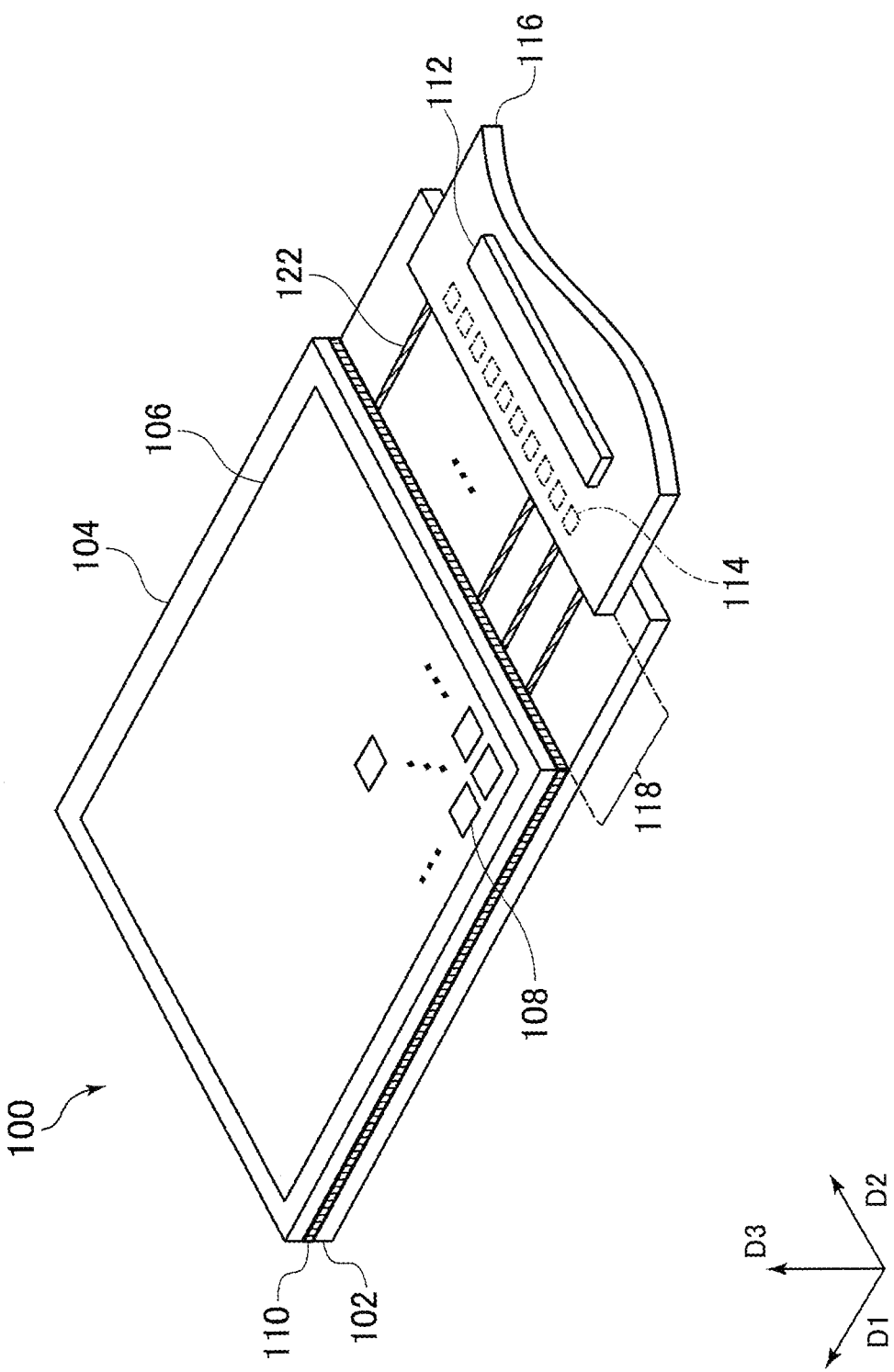
FIG. 2 is a perspective view which illustrates a configuration of a display panel.
Figure 3:
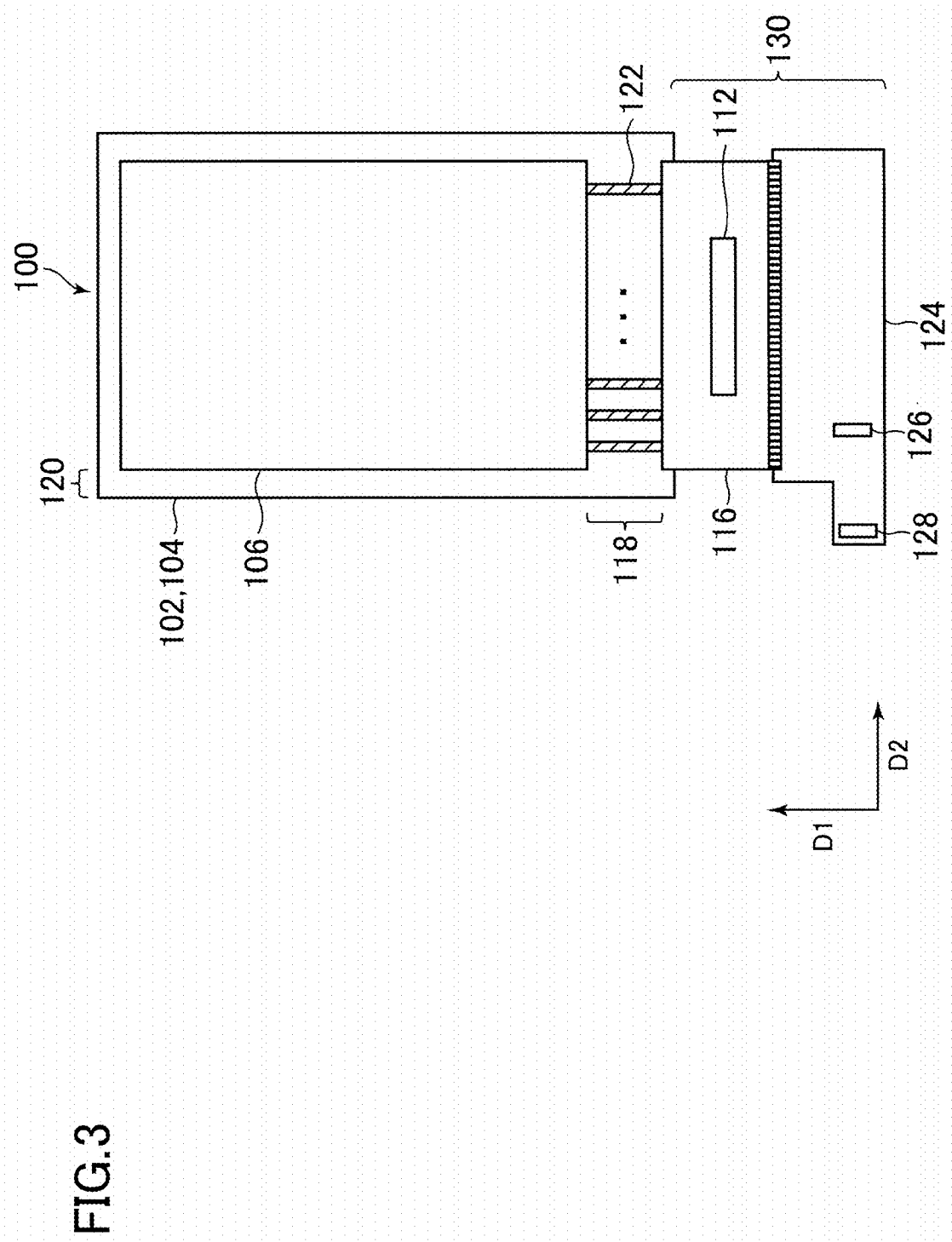
FIG. 3 is a plan view which illustrates the configuration of the display panel.

Next, a configuration of the display panel 100 which the display device 1 according to the present embodiment has is explained with reference to FIGS. 2 and 3. FIG. 2 is a perspective view which illustrates the configuration of the display panel 100. FIG. 3 is a plan view which illustrates the configuration of the display panel 100.

The display panel 100 according to the present embodiment has a first substrate 102, a second substrate 104, a third substrate 116, and a fourth substrate 124. Note that in FIG. 2, the fourth substrate 124 is not illustrated.

Each of the first substrate 102, the second substrate 104, the third substrate 116, and the fourth substrate 124 are substrates made of resin having flexibility such as polyimide and polyethylene terephthalate. The substrates are formed to have a thickness, for example, of 10-20 μm. Further, the first substrate 102 includes a display area 106, a bendable area 118, and a frame area 120.

At one edge part of the first substrate 102, a substrate connection part 114 is further provided. On the substrate connection part 114, the third substrate 116 is disposed which is a wiring substrate and connects the display panel 100 to a device to output an image signal, a power source, and the like.

The display area 106 has a pixel array part where a plurality of pixels 108 are arranged in matrix. The pixel array part includes at least one terminal to supply each pixel with a power and a signal for having the pixel emit light. The terminal included in the pixel array part is, for example, a terminal to which a scan signal, an image signal, and a power supplied from the driver IC 112 provided on the third substrate 116 via a connection wiring 122 provided on the bendable area 118 are input.

On the upper surface of the display area 106, the second substrate 104 as a sealing member is provided. The second substrate 104 is fixed to the first substrate 102 by a seal material 110 which surrounds the display area 106. The display area 106 formed on the first substrate 102 is sealed by the second substrate 104 and the seal material 110 which are sealing members so that the display area 106 is not exposed to the atmosphere. According to a sealing structure like this, a deterioration of a lighting element provided in the pixel 108 is suppressed.

The frame area 120 is arranged around the display area 106. Specifically, on the frame area 120, an inorganic film 204 (see FIG. 4) is arranged so as to cover the display area 106. On right and left frame parts, on the inorganic film 204, a circuit for generating a signal to select a row of the pixel array part, and the like are arranged. On upper and lower frame parts, a wiring to route a power, a wiring to distribute a data signal, and the like are arranged.

The bendable area 118 has the connection wiring 122 which connects the display area 106 and the terminal area 130 to each other, and is arranged between the pixel array part and the connection terminal 128.

The third substrate 116 and the fourth substrate 124 include a terminal area 130. The terminal area 130 is positioned on the backside of the display area 106 due to the bending of the bendable area 118. Further, the terminal area 130 has the connection terminal 128 to which a signal is supplied from an external device, and the connection terminal 128 is arranged on the third substrate 116 and/or the fourth substrate 124 and therefore is also positioned on the backside of the display area 106.

The third substrate 116 is a wiring substrate connected to the first substrate 102. On the third substrate 116, the driver IC 112 is disposed. The driver IC 112 supplies, via the connection wiring 122, the pixel array part with a data signal and an electric power source voltage supplied from the fourth substrate 124. The plurality of pixels 108 included in the pixel array part emit light by the electric power and the data signal, and an image is displayed on the display area 106.

The fourth substrate 124 is connected to the third substrate 116. On the fourth substrate 124, a circuit component 126 and a connection terminal 128 are disposed. The connection terminal 128 is, for example, a connecter for external connection, and is connected to an external device which supplies the pixel array part with an electric power and a data signal. Further, the connection terminal 128 supplies an electronic circuit (not illustrated) constituted by the circuit component 126 with the electric power and the data signal. The electric power and the data signal generated by the electronic circuit is supplied to the pixel array part via the connection wiring 122.

Figure 4:
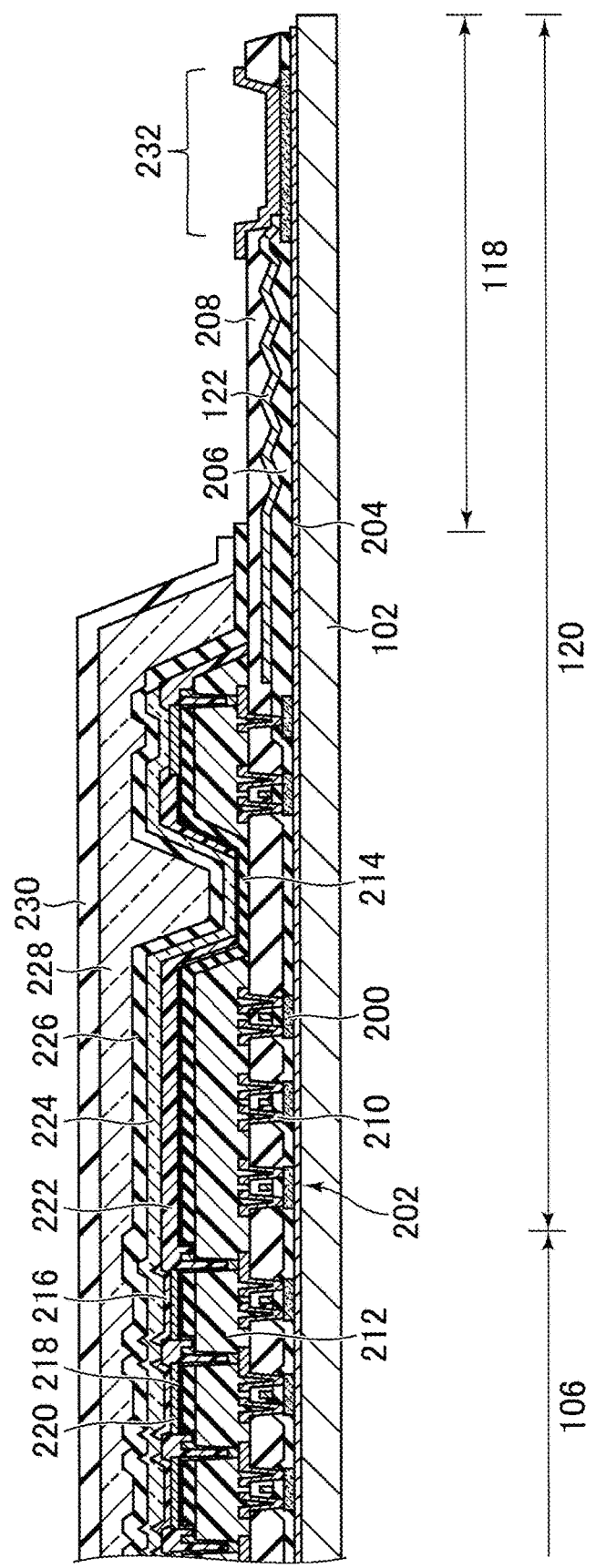
FIG. 4 is a cross sectional view which illustrates the configuration of the display panel.

Subsequently, the cross section of the display panel 100 before it is bent is explained. Here, as an example, a configuration of an organic EL display panel is shown. FIG. 4 is a view of the cross section of an area ranging from the display area 106 to the bendable area 118 of FIG. 3. Note that the cross sectional view of the bent state to be describe later (see FIG. 6) shows the configuration where the display panel 100 includes a spacer, a reinforcement film, and the like, but in FIG. 4, the spacer, the reinforcement film, and the like are omitted.

The first substrate 102 is a film of a material having flexibility such as polyimide, and polyethylene terephthalate. On the surface of the first substrate 102, an inorganic film 204 to be a barrier against impurities included in the first substrate 102 is disposed. The inorganic film 204 is an under insulating layer. The inorganic film 204 is formed of a film composed of three or five layers, made by alternately disposing a nitride film and an oxide film. The nitride film and the oxide film have a thickness of 20-50 nm or 100-500 nm.

On the inorganic film 204, a semiconductor layer 200 is laminated. By this semiconductor layer 200, a transistor 202 of the pixel circuit, and a channel area, a source area, and a drain area of the transistor 202 of an adjacent circuit are formed. The semiconductor layer 200 is a p-Si layer formed by processing an a-Si layer by the ELA (Excimer Laser Annealing). The semiconductor layer 200 has a thickness of, for example, 50 nm.

On the semiconductor layer 200, a gate insulating film 206 made of silicon oxide or the like is disposed. In the bendable area 118 as described above, at least the upper surface of the gate insulating film 206 has an uneven shape, though the details of this will be described later. Further, the upper surface of the inorganic film 204 may also have an uneven shape. In this case, the upper surface of the gate insulating film 206 formed on the inorganic film 204 is formed to have an uneven shape similar to the uneven shape of the upper surface of the inorganic film 204. The gate insulating film 204 is formed of, for example, $Si(OC_2H_5)_4$ to have a thickness of 80-100 nm. Hereinafter, the lamination structure of the first substrate 102, the inorganic film 204, and the gate insulating film 206 inside the bendable area 118 is referred to as an under layer 300.

On the under layer 300, the connection wiring 122 is disposed. The connection wiring 122 is formed to fit to the uneven shape that the upper surface of the under layer 300 as described above (gate insulating film 206) has. The connection wiring 122 is formed of MoW. Further, the connection wiring 122 may be formed by laminating Ti having a thickness 100-200 nm, TiAl having a thickness 100-300 nm, and Ti having a thickness 100-200 nm.

The uneven shape as described above is a shape where the connection wiring 122 repeatedly turns in directions of a thickness of the under layer 300. Besides that, it is favorable that this uneven shape is wedge-shaped or wave-shaped. Further, it is sufficient that this uneven shape is formed at least in an area where the connection wiring 122 is provided inside the bendable area 118.

As the interlayer insulating film and the coating film of the connection wiring 122, a first inorganic insulating film 208 is disposed on the gate insulating film 206 and the connection wiring 122. The first inorganic insulating film 208 inside the bendable area 118 may be formed to fit to the uneven shape which the upper surface of the under layer 300 and the connection wiring 122 have. Or, the first inorganic insulating film 208 inside the bendable area 118 may be formed so as to planarize the uneven shape which the upper surface of the under layer 300 and the connection wiring 122 have. The first inorganic insulating film 208 is formed by laminating, for example, a nitride film having a thickness of 300 nm, and an oxide film having a thickness of 300-400 nm.

On the first inorganic insulating film 208, a pixel wiring layer 210 is disposed. The pixel wiring layer 210 is formed by, for example, laminating Mo having a thickness 100-200 nm, AlNd having a thickness 300-600 nm, and Mo having a thickness of 30-100 nm. Further, the pixel wiring layer 210 may be formed by laminating Ti, Al and Ti. The pixel wiring layer 210 electrically connects a lower electrode 220 and a reflective film 218 to the semiconductor layer 200 of the transistor 202 through a contact hole penetrating the inorganic film 204 and the gate insulating film 206.

An organic planarizing film 212 formed of an organic material is disposed to cover the pixel wiring layer 210. The organic planarizing film 212 has a thickness of 2-3 μm, and is formed of polyimide, acrylic resin, or the like. The organic planarizing film 212 planarizes unevenness under the organic planarizing film 212.

In order to prevent infiltration of moisture into the organic EL film 216 from the organic planarizing film 212 and the like, a second inorganic insulating film 214 is disposed on the surface of the organic planarizing film 212. The second inorganic insulating film 214 is formed of a material which is moisture proof and insulating. For example, the second inorganic insulating film 214 is formed by laminating a nitride film and an oxide film. The second inorganic insulating film 214 may be formed of a nitride film to have a thickness of, for example, 200 nm.

On the second inorganic insulating film 214, a reflective film 218 and a lower electrode 220 are disposed. The reflective film 218 is formed of a material which reflects light such as MgAg. The lower electrode 220 is electrically connected to the source electrode of the transistor 202 through a contact hole which penetrates the second inorganic insulating film 214 and the organic planarizing film 212. Specifically, for example, the lower electrode 220 is formed by laminating Indium Tin Oxide having a thickness of 30-60 nm, Silver having a thickness of 100-150 nm, and Indium Tin Oxide having a thickness of 10-20 nm. Instead of Indium Tin Oxide, Indium Zinc Oxide may be used. The lower electrode 220 corresponds to an anode of the organic EL element disposed in each pixel.

An organic bank layer 222 is disposed on the reflective film 218 and the lower electrode 220. The organic bank layer 222 is disposed along a border of the pixels, and has an opening at the position of a lighting surface of the organic EL film 216. At the bottom of the opening, the organic EL film 216 including the light emitting layer is disposed. The organic bank layer 222 is formed of polyimide, acrylic resin, or the like, and is arranged to have a thickness of 1-2 μm.

The organic EL film 216 is formed to include a hole injection layer, a hole transport layer, a light emitting layer, an electron injection layer, an electron transport layer, and the like. The light emitting layer is formed using materials which emit lights in red, green, and blue for each pixel.

An upper electrode 224 is disposed on the organic EL film 216. The upper electrode 224 is disposed to cover the area ranging from the display area 106 to the frame area 120. The upper electrode 224 is a common electrode which covers all the pixels of the pixel array part. The upper electrode 224 is formed of a material which transmits light emitted by the organic EL film 216. For example, the upper electrode 224 is formed of a transparent conductive material such as Indium Zinc Oxide and Indium Tin Oxide. Note that the upper electrode 224 is electrically connected to the lower electrode 220 formed in the frame area 122 through the contact hole. The upper electrode 224 corresponds to a cathode of the organic EL element disposed in each pixel.

On the whole of the display area 106 where the organic EL element composed of the lower electrode 220, the organic EL film 216, and the upper electrode 224 is disposed, a sealing film is disposed which seals the upper surface of the organic EL film 216 and prevents deterioration of the organic EL film 216 due to moisture. The sealing film is formed by laminating the first inorganic sealing film 226, the organic sealing film 228, and the second inorganic sealing film 230. For example, the sealing film is formed by laminating a nitride film having a thickness of 1-10 μm, a resin layer having a thickness of 5-50 μm, and a nitride film having a thickness of 1-10 μm.

Further, the display panel 100 has an external contact part 232 where the pixel wiring layer 210 is exposed, at the right edge of FIG. 4. At the external contact part 232, the pixel wiring layer 210 and a terminal disposed on the third substrate 116 are electrically connected.

Figure 5:
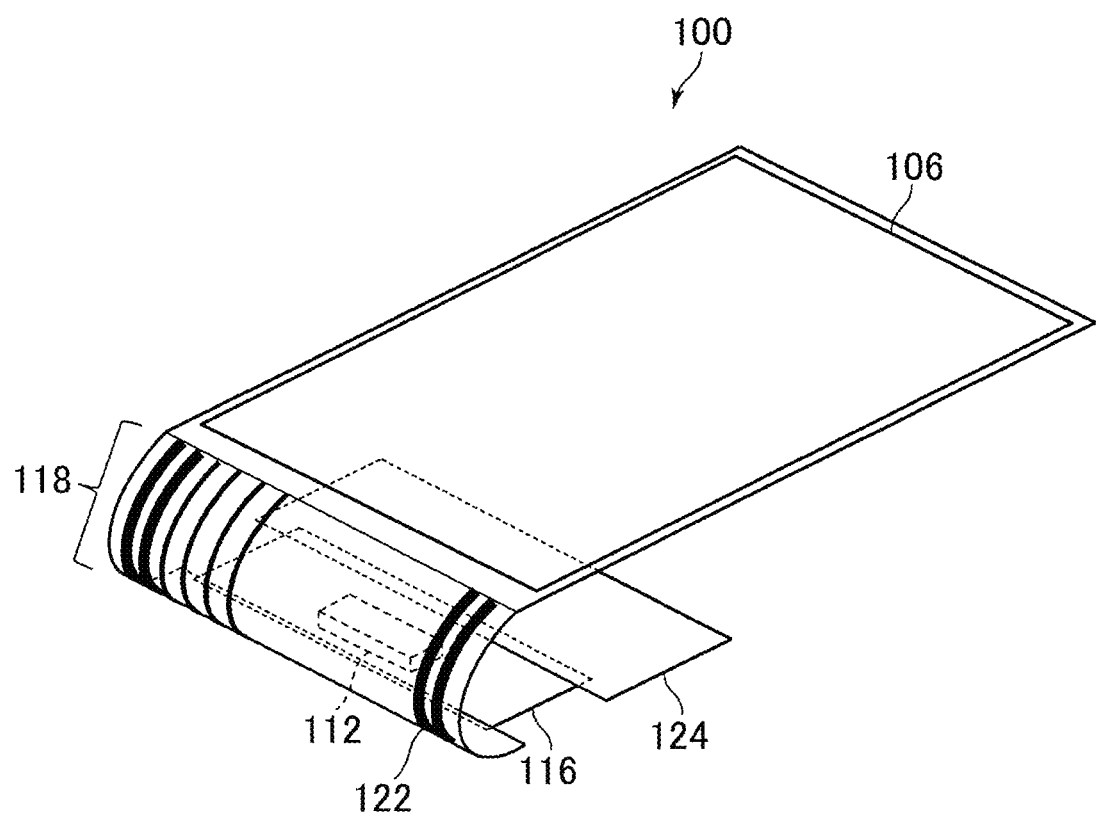
FIG. 5 is a view of a bent state of the display panel.

Subsequently, the display panel 100 after it is bent is explained. The display panel 100 is bent after the third substrate 116 is connected to the external contact part 232. FIG. 5 is a view of a bent state of the display panel 100. As the bendable area 118 is bent, the third substrate 116 and the fourth substrate 124 are positioned on the backside of the display area 106.

Figure 6:
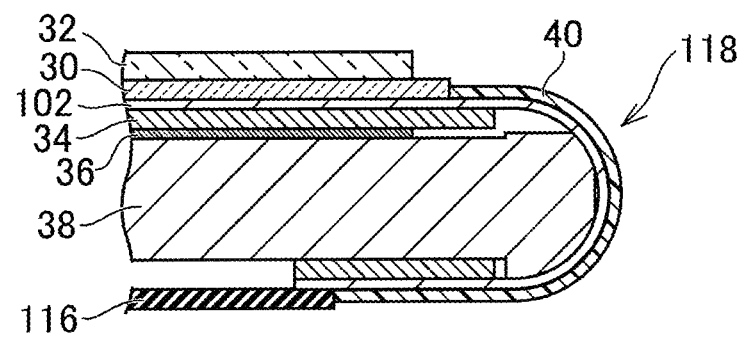
FIG. 6 is a cross sectional view which illustrates a configuration of the bent state of the display panel.

FIG. 6 is a schematic cross sectional view of the display panel 100 around the bendable area 118. As shown in FIG. 6, the display panel 100 includes the first substrate 102, a protective film 30, a polarizing plate 32, a first reinforcement film 34, a heat diffusion sheet 36, a spacer 38, and a second reinforcement film 40.

The first substrate 102 is bent at the bendable area 118. Note that although in FIG. 4, the configuration is shown where the semiconductor layer 200 to the second inorganic sealing film 230 are included in the display panel 100, here the semiconductor layer 200 to the second inorganic sealing film 230 are not illustrated.

The protective film 30 is a film to protect the display panel 100. Specifically, the protective film 30 is a film to protect the surface of the second inorganic sealing film 230 disposed on the first substrate 102.

The polarizing plate 32 decreases reflection of external light incident on the display panel 100. Owing to the polarizing plate 32, the visibility of the display device 1 improves.

The first reinforcement film 34 is a film which reinforces the display panel 100. The first reinforcement film 34 is disposed on a flat area of the display panel 100 in a bent state. Specifically, the first reinforcement film 34 is disposed on the back side surface of the display area 106 of the display panel 100.

The heat diffusion sheet 36 is a sheet to diffuse heat of the display panel 100. Specifically, the heat diffusion sheet 36 diffuses heat generated at the driving circuit disposed in the vicinity of the display panel 100 to the whole of the display panel 100. The heat diffusion sheet 36 prevents local temperature rising which occurs only at a part of the display panel 100.

The spacer 38 is arranged between a front side part and a backside part of the bent display panel 100. The spacer 38 keeps the separation between the front side part and the backside part to be more than a predetermined level. Because of the spacer 38, the curvature of the bendable area 118 is kept within the acceptable range, even if a pressure is applied to the display panel 100 in a thickness direction.

Further, the edge part of the spacer 38 is formed to be a curved surface having the curvature in accordance with the backside of the curved area 118. By having the edge part of the spacer 38 contact the backside of the bendable area 118, even when a pressure is applied onto the surface of the bendable area 118, the shape of the bendable area 118 can be kept unchanged. Because of the spacer 38, the pressure applied to the connection wiring 122 disposed on the bendable area 118 can be reduced, which makes a breakage of the connection wiring 122 hard to occur.

The second reinforcement film 40 is a film which enforces the display panel 100. The second reinforcement film 40 is disposed on the bendable area 118 of the display panel 100 in the bent state. Specifically, the second reinforcement film 40 is disposed on the frontside of the bendable area 118 of the display panel 100. The second reinforcement film 40 is formed of a predetermined material and has a predetermined thickness so that it can be bent more easily than the first reinforcement film 34 can be.

Note that it may be configured to not attach the second reinforcement film 40 to the bendable area 118. According to such a configuration, the flexibility of the bendable area 118 improves, and the display panel 100 can be bent with a smaller radius of curvature. The smaller the radius of curvature of the bendable area 118 gets, the smaller the size of the bent display panel 100 in a plan view and the thickness of the bent display panel 100 get.

As has been seen above, the third substrate 116 and the fourth substrate 124 which are farther than the bendable area 118 when seen from the display area 106 can be folded back to the backside of the display area 106. By folding them back like this, the size of the display panel 100 in a plan view can be made smaller, and the display device 1 onto which the display panel 100 is loaded can be downsized. Further, with respect to the display panel 100, since the part ahead of the bendable area 118 of the first substrate 102 is hidden behind, a ratio of the display area 106 in the front side of the display device 100 can be made larger.

Further, the frame area 120 which is positioned on the display surface side is not to be used as a mounting area of a component such as an IC. Therefore, the driver IC 112 and the like are to be loaded on a part of the display panel 100 which is folded back to the backside. According to this configuration, the frame area 212 can be downsized, and what is called a narrow frame of the display device 1 can be attained.

Subsequently, the connection wiring is explained. FIGS. 7A and 7B are views which schematically show the shapes of the connection wirings to be disposed.

FIG. 7A shows an example of the shapes of the connection wirings which are adopted in the conventional technologies. As shown here, as compared with the case where the connection wiring is formed to be linear, while smaller portions of the connection wirings are parallel to the bending direction, an area necessary to form the connection wiring largely increases.

FIG. 7B shows non-linear shapes of the connection wirings which are more similar to the linear shape than the shapes of the connection wirings in FIG. 7A. In the present invention, as described above, the upper surface of the gate insulating film 206 in the bendable area 118 has the uneven shape where the extension direction of the connection wiring 122 repeatedly changes as to the directional component parallel to the thickness direction of the under layer 300. Further, the connection wiring 122 is provided on the uneven shape as described above. Due to this, smaller portions of the connection wiring 122 are parallel to the bending direction. Therefore, even if it is formed linear in a plan view, or as shown in FIG. 7B, if it is formed to be more linear than the conventional non-linear shape is, smaller portions of the connection wiring layer 122 are parallel to the bending direction.

Hereinafter, the structure of the bendable area 118 is explained. Note that in the explanation below, it is assumed that the bendable area 118 is in a state before it is bent. Further, the first inorganic insulating film 208 formed as the covering layer on the under layer 300 and the connection wiring 122 is not illustrated here.

Figure 8:
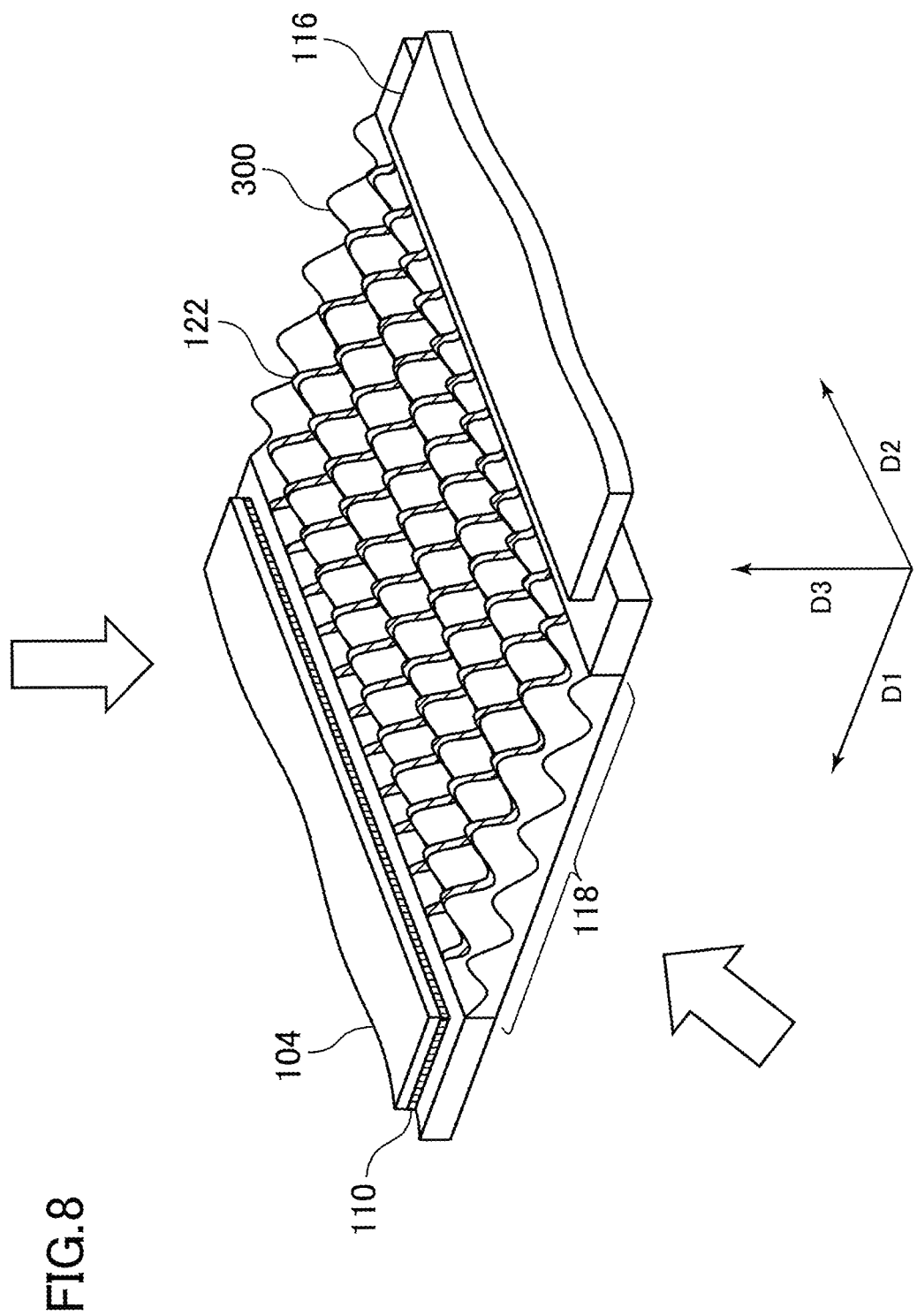
FIG. 8 is a perspective view which illustrates a structure of a bendable area according to a first embodiment of the present invention.

FIG. 8 is a perspective view which illustrates the structure of the bendable area 118 according to the first embodiment of the present invention. As shown in FIG. 8, in the bendable area 118, the connection wiring 122 is disposed along the uneven shape the upper surface of the under layer 300 has, which in particular is the wedge shape here.

Figure 9:
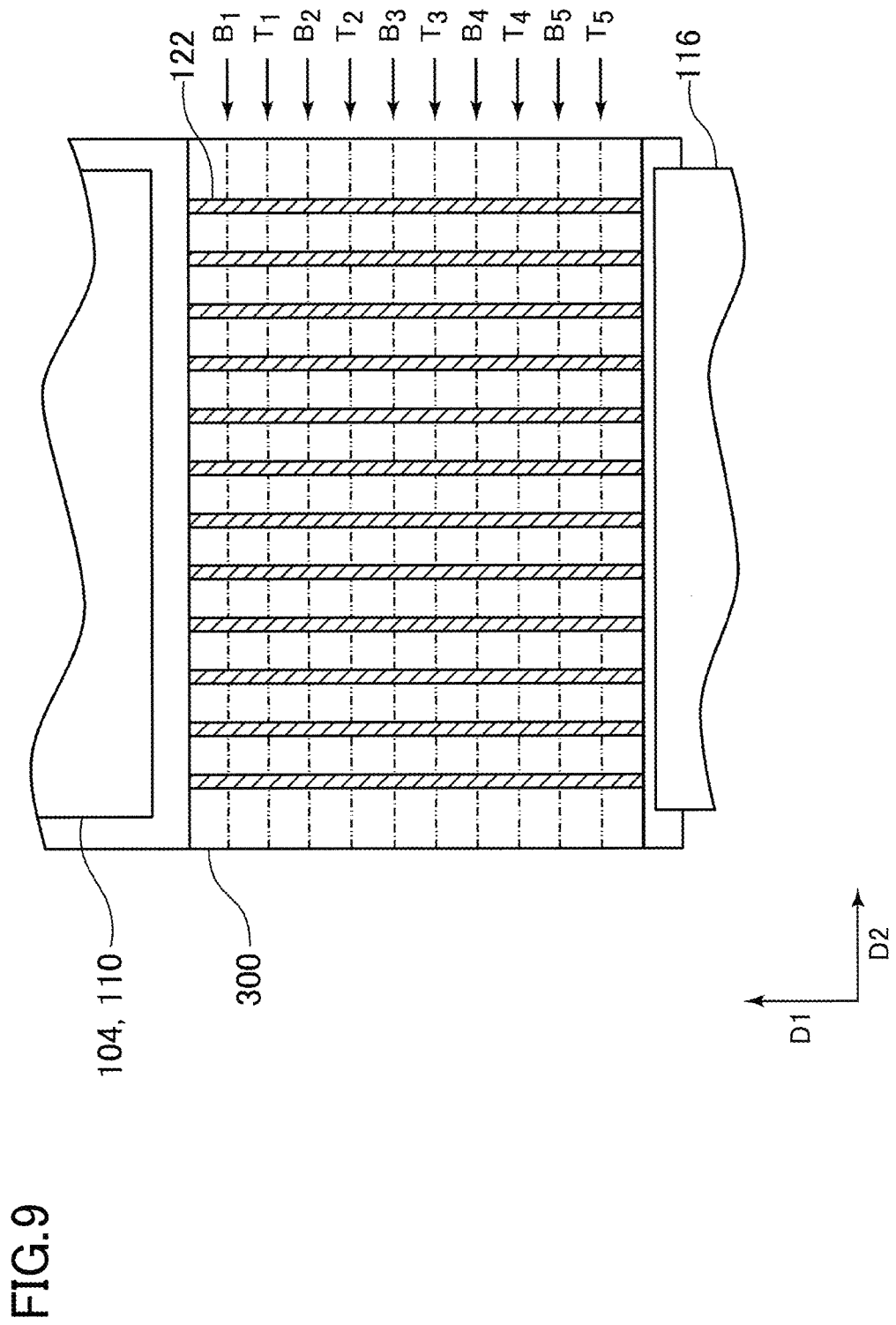
FIG. 9 is a schematic plan view which illustrates a structure of the bendable area according to the first embodiment of the present invention.
Figure 10:
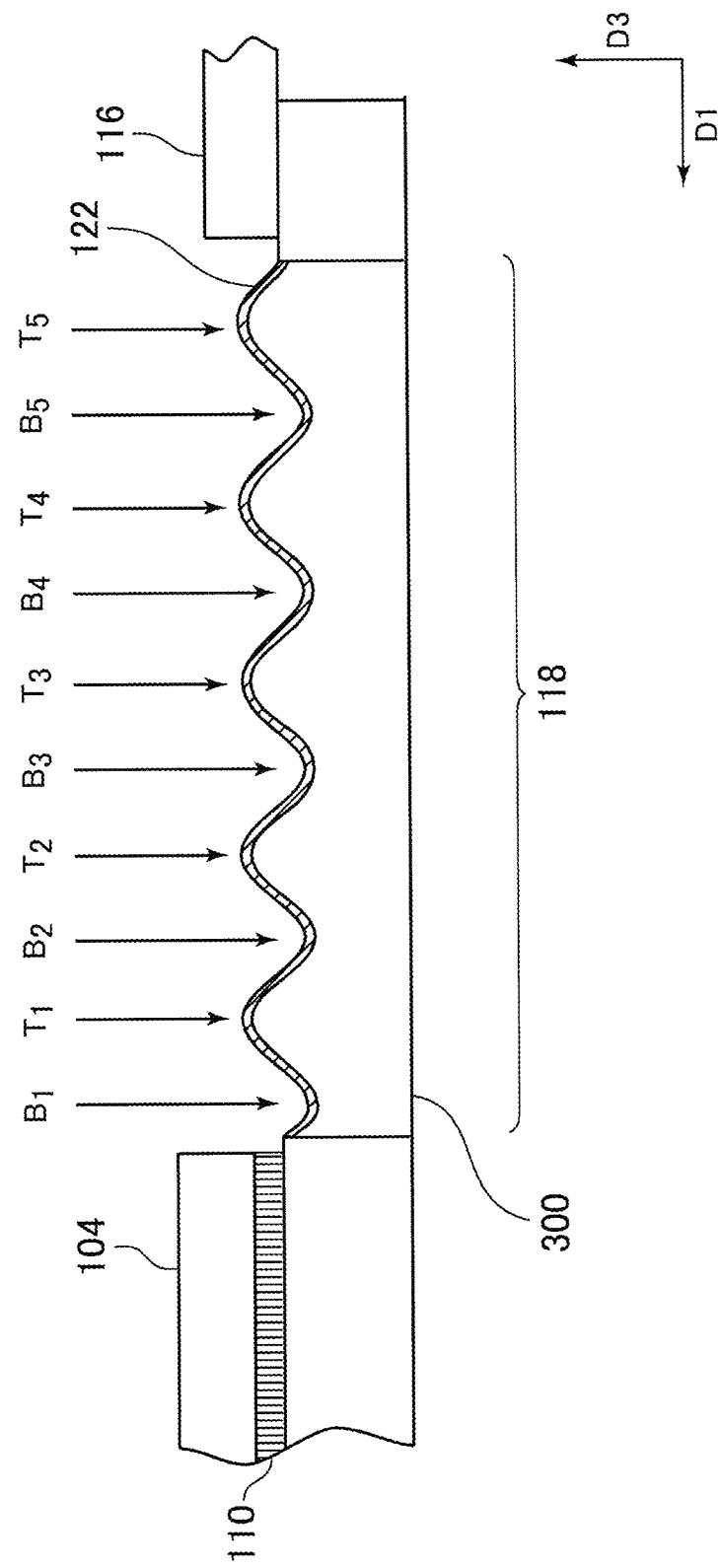
FIG. 10 is a schematic lateral view which illustrates the structure of the bendable area according to the first embodiment of the present invention.

The structure of the bendable area 118 according to the first embodiment shown in FIG. 8 is shown in a plan view and a lateral view in FIGS. 9 and 10, respectively. FIG. 9 is a schematic plan view which illustrates the structure of this bendable area 118 when viewed from D3 direction. FIG. 10 is a schematic lateral view which illustrates the structure of this bendable area 118 when viewed from D2 direction (from the left side). In this embodiment, the parts drawn by one dotted chain lines in FIG. 9 ($B_1$, $B_2$, $B_3$, $B_4$, and $B_5$ in FIGS. 9 and 10) constitute the trough planes, and the parts drawn by two dotted chain lines in FIG. 9 ($T_1$, $T_2$, $T_3$, $T_4$, and T$_5$ in FIGS. 9 and 10) constitute the crestal planes. Note that here the connection wiring 122 is formed to be linear in a plan view.

Figure 11:
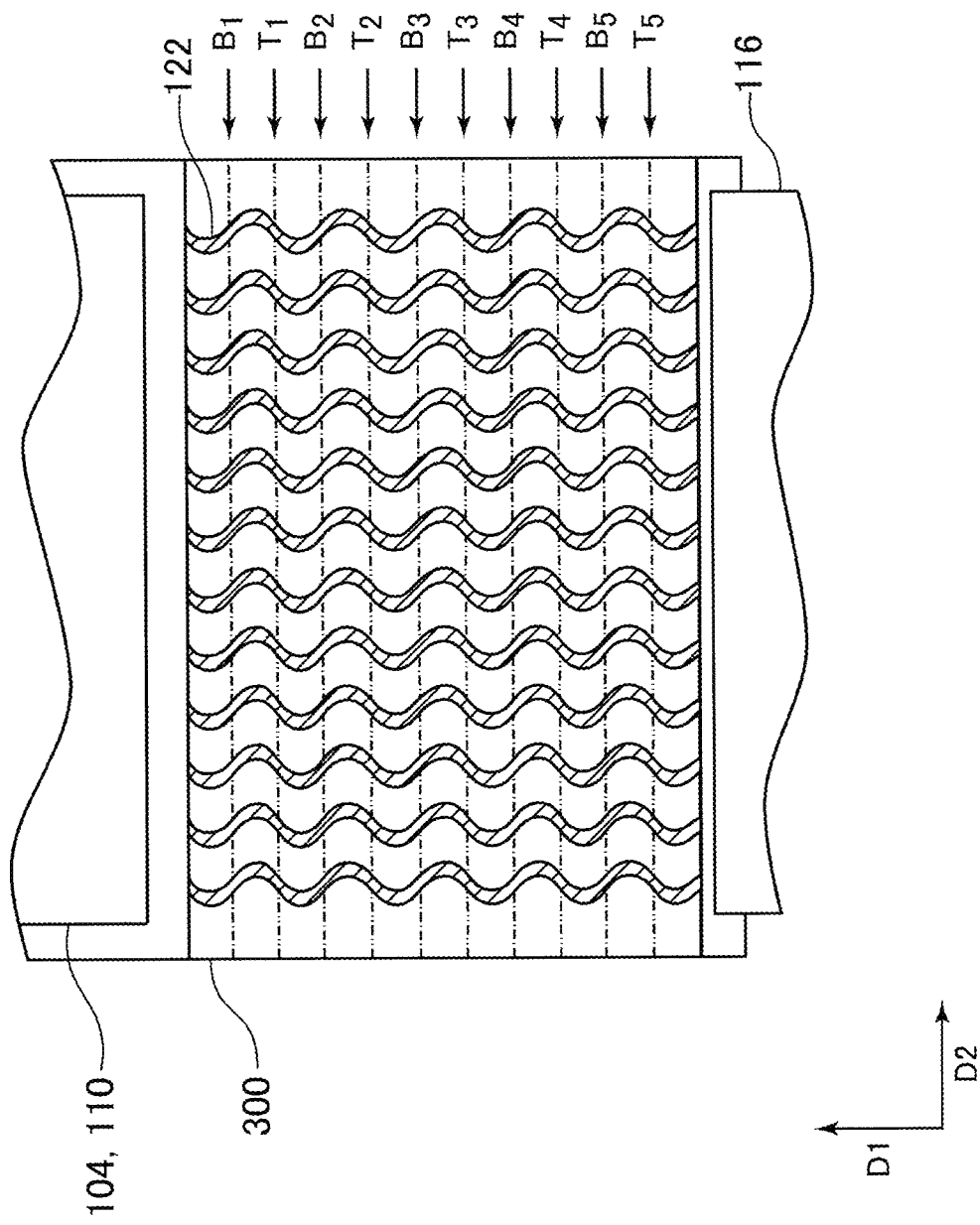
FIG. 11 is a schematic plan view which illustrates a structure of a bendable area of variation 1 according to the first embodiment of the present invention.
Figure 12:
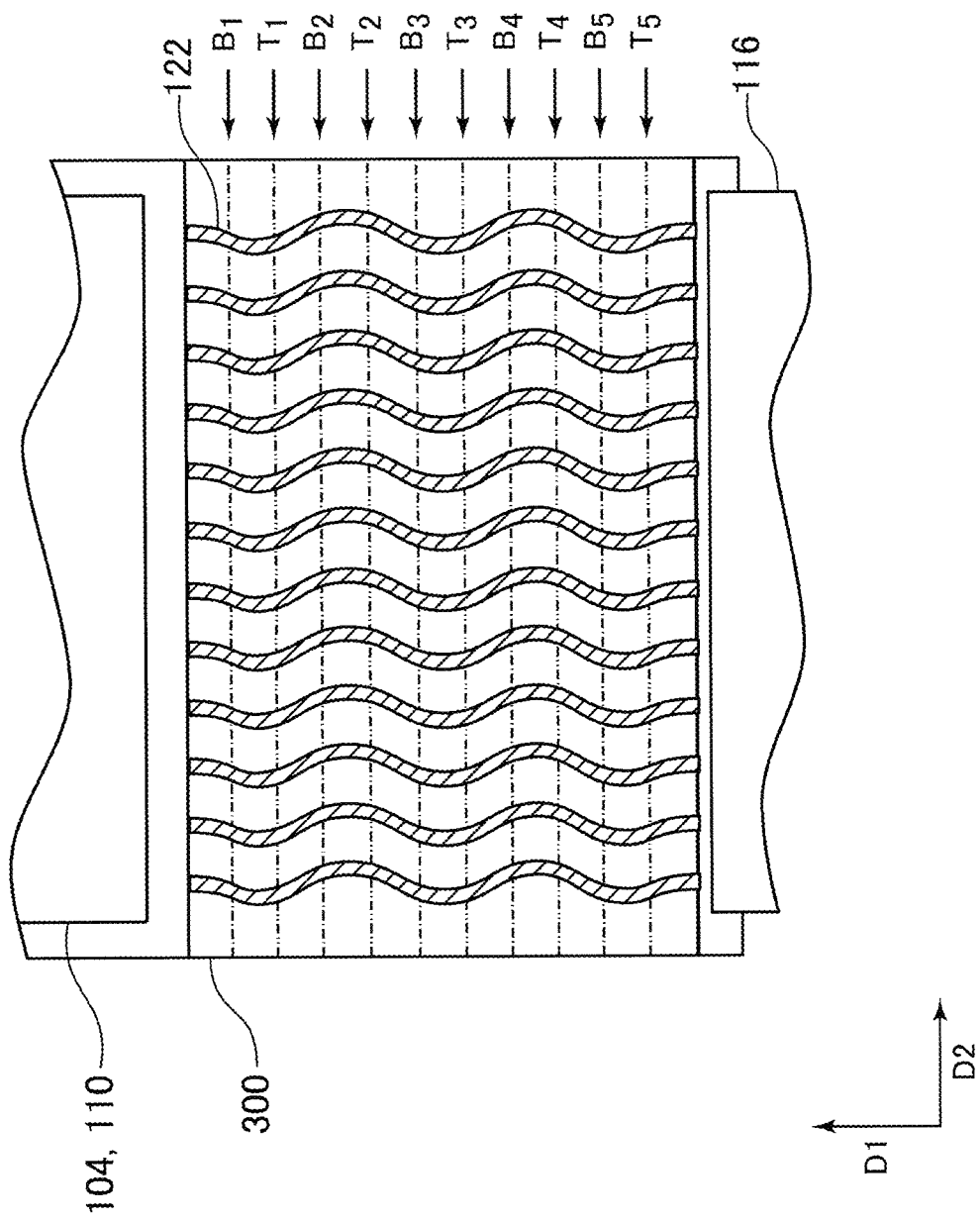
FIG. 12 is a schematic plan view which illustrates a structure of a bendable area of variation 2 according to the first embodiment of the present invention.

FIGS. 11 and 12 are schematic plan views which respectively illustrate the structure of the bendable area 118 of a variation of the first embodiment of the present invention. In FIGS. 11 and 12 the shape of the connection wiring 122 provided on the under layer 300 is like a sine-wave. Moreover, in FIG. 12, the shape has a repetitive cycle longer than the one in FIG. 11 by one cycle. Like this, in the case where the connection wiring 122 is formed to be like a sine-wave, by making the repetitive cycle longer, the connection wiring 122 can be made to be more linear. Further, in FIGS. 11 and 12, the top parts of the connection wiring 122 are arranged so as not to overlap with the trough planes or the crestal planes of the under layer 300.

Figure 13:
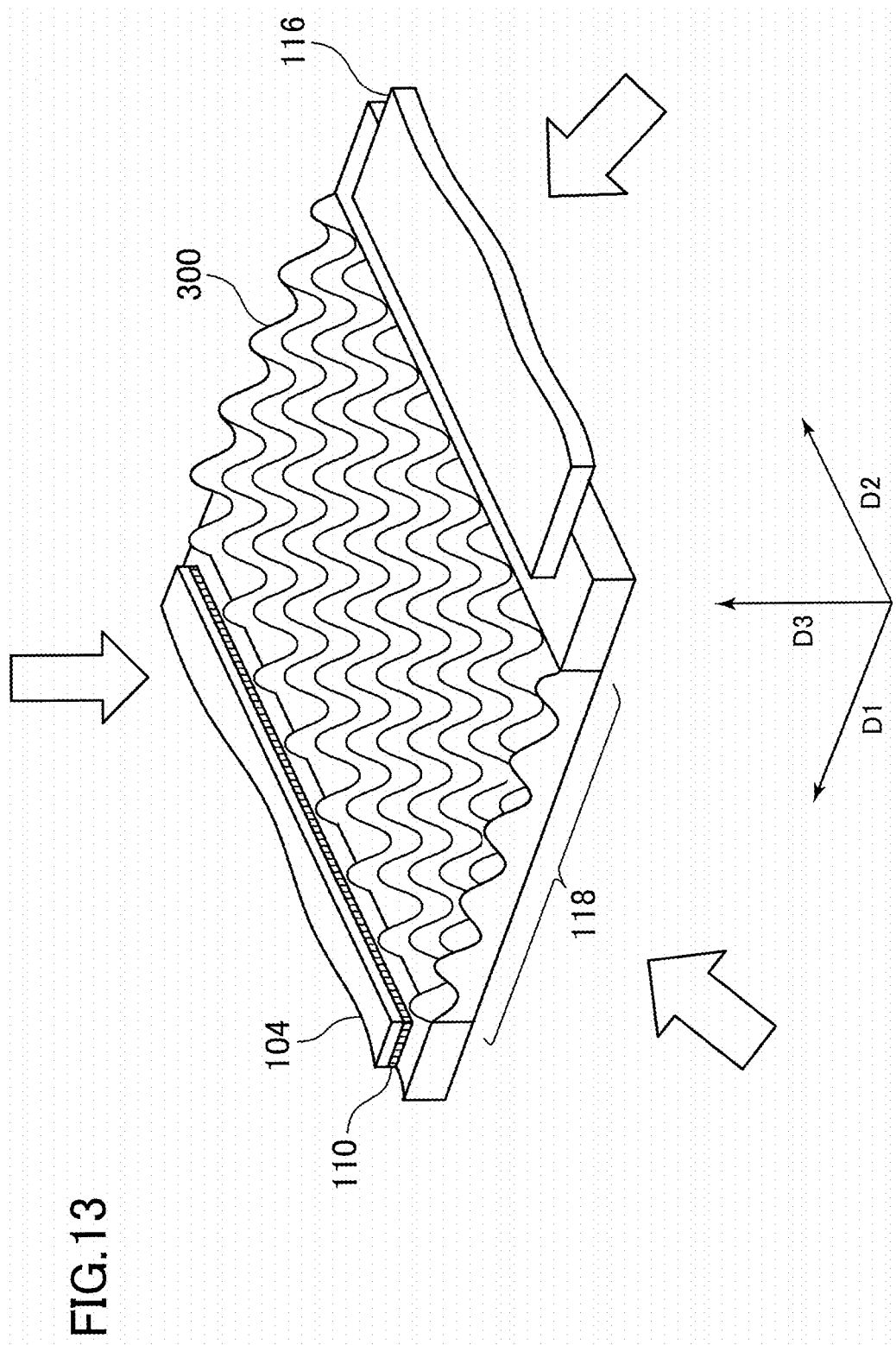
FIG. 13 is a perspective view which illustrates a structure of a bendable area according to a second embodiment of the present invention.

FIG. 13 is a perspective view which illustrates the structure of the bendable area 118 according to the second embodiment. To avoid a situation where it becomes harder to understand the shape of the upper surface of the under layer 300 due to complication of the figure, the wiring 122 is omitted. As shown in FIG. 13, in the bendable area 118, the connection wiring 122 is formed to have the uneven shape which the upper surface of the under layer 300 has, which in particular is a wave shape here. The wave shape here is formed so that a trough part and a crest part would appear alternately. And, the connection wiring 122 is provided, though not shown, on the under layer 300 having this wave shape.

Figure 14:
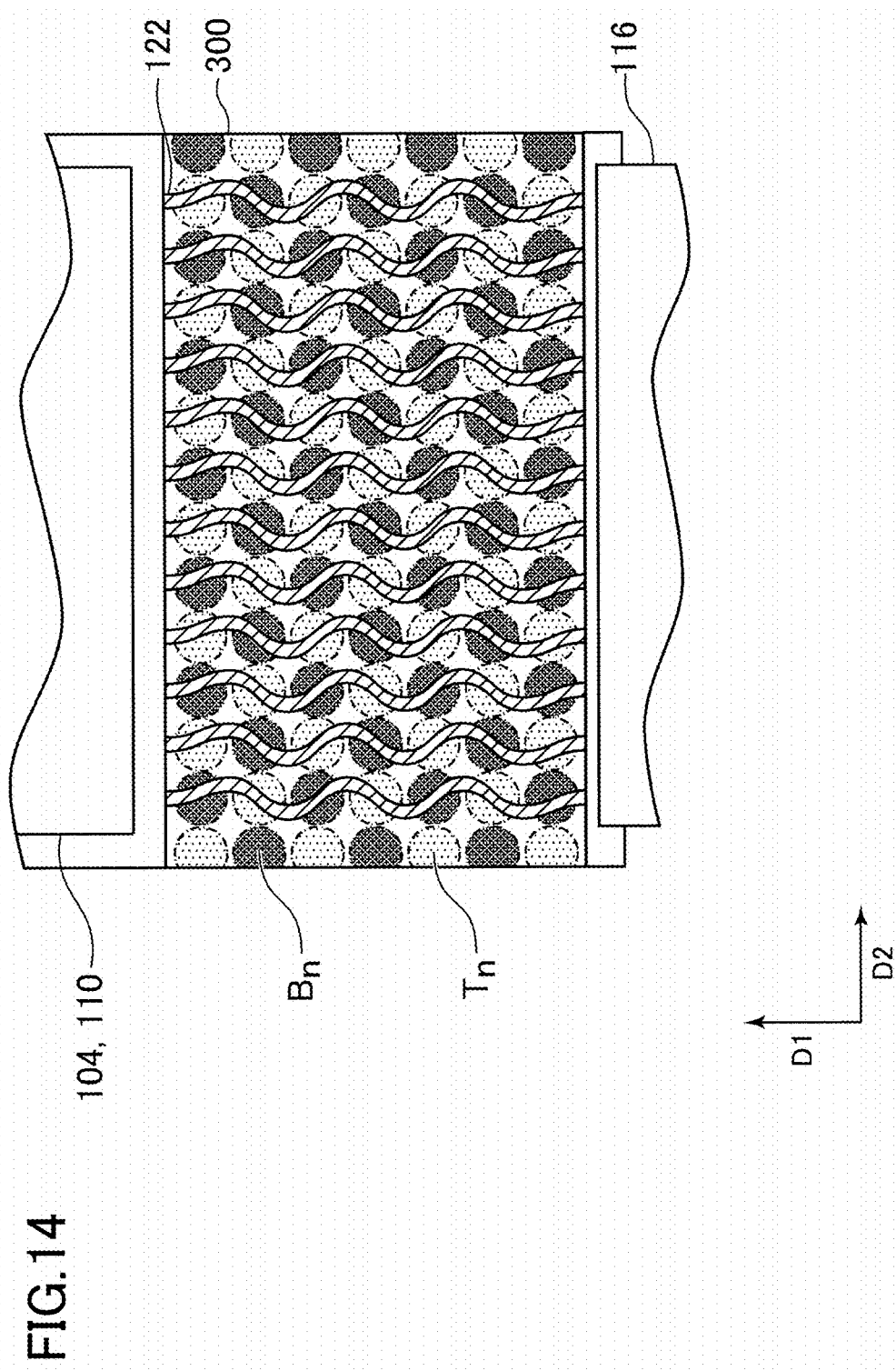
FIG. 14 is a schematic plan view which illustrates the structure of the bendable area according to the second embodiment of the present invention.
Figure 15:
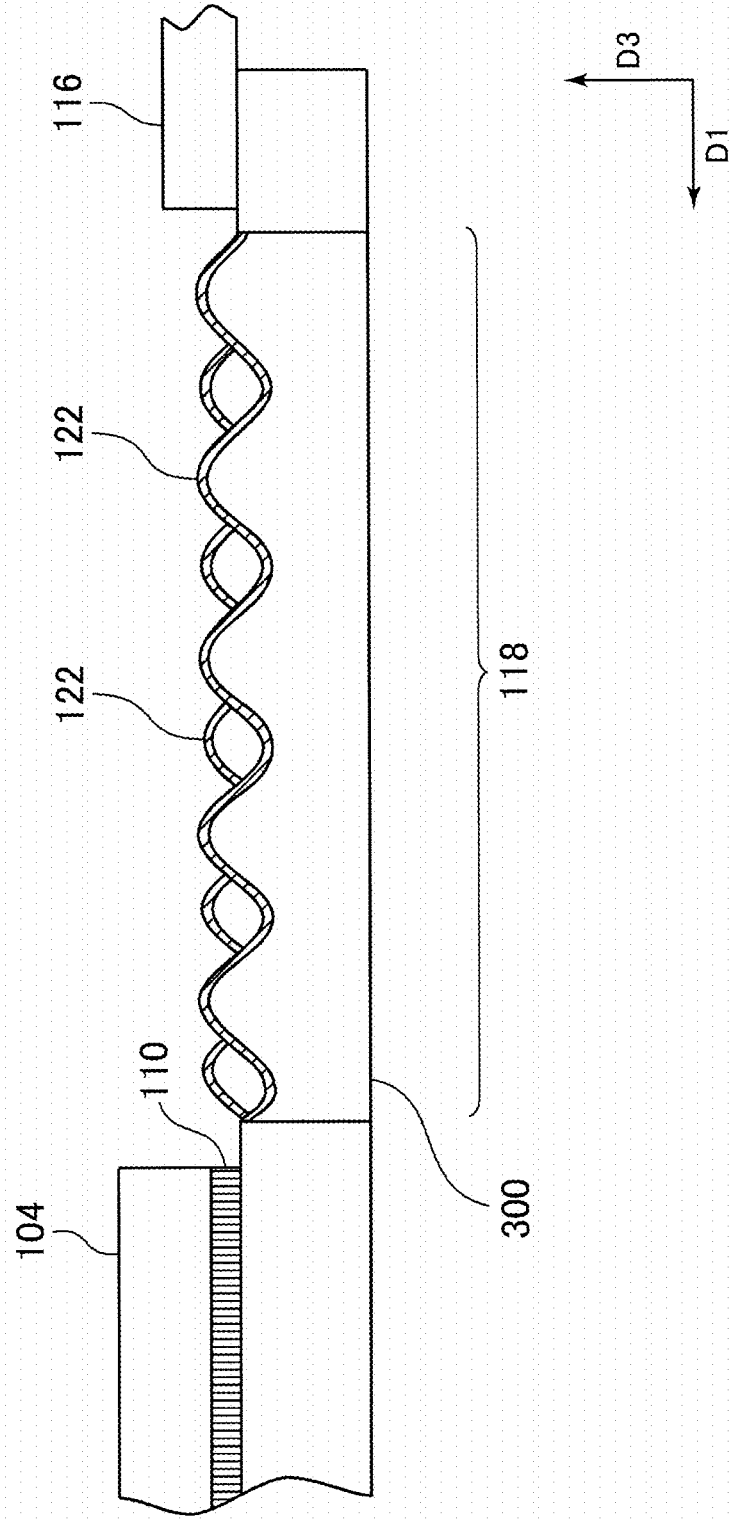
FIG. 15 is a schematic lateral view which illustrates the structure of the bendable area according to the second embodiment of the present invention.
Figure 16:
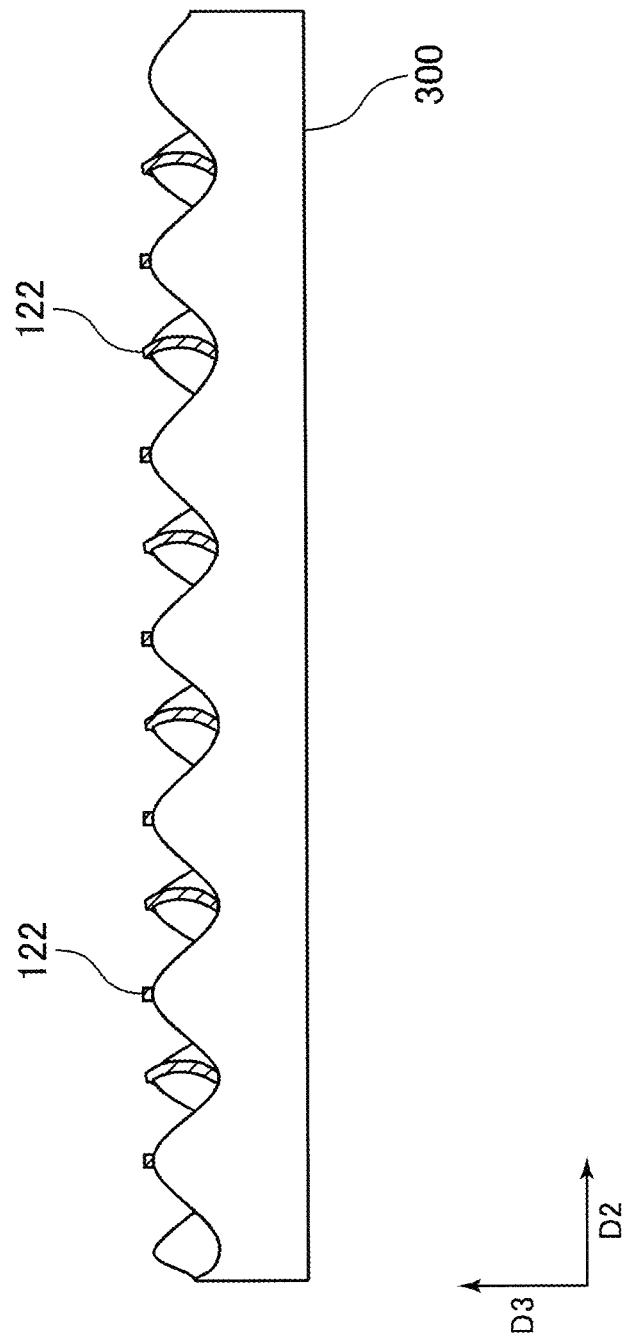
FIG. 16 is a schematic front view which illustrates the structure of the bendable area according to the second embodiment of the present invention.

A plan view, a lateral view, and a front view of the structure of the bendable area 118 according to the second embodiment shown in FIG. 13 are shown in FIGS. 14-16. FIG. 14 is a schematic plan view which illustrates the structure of this bendable area 118 viewed from D3 direction. In FIG. 14, in order to make the wave-shape of the upper surface of the under layer 300 visually more understandable in a plan view, the crest parts of the under layer 300 are depicted as lightly shaded areas (T$_n$), and the trough parts of the under layer 300 are depicted as darkly shaded areas (B$_n$). Further, regarding the connection wiring 122, as in the case of the first embodiment, the top parts of the connection wiring 122 are arranged so as not to overlap with the trough planes of the under layer 300 or the crestal planes of the under layer 300.

FIG. 15 is a schematic lateral view which illustrates the structure of this bendable area 118 viewed from D2 direction (from the left side). Here, the under layer 300 has a wave shape, and thus through the trough parts, the connection wiring 122 can be seen which is formed along the crest parts behind the trough parts.

FIG. 16 is a schematic front view which illustrates the structure of this bendable area 118 viewed from D1 direction. As described as above, in the case of the second embodiment, the top parts of the connection wiring 122 are formed so as not to overlap with the trough parts of the under layer 300 or the crest parts of the under layer 300. Therefore, here, the top parts of the connection wiring 122 are formed to extend over the parts of the surface of the under layer 300 which are not sloped or are only gently sloped, and which are not the crest parts or trough parts.

Note that the connection wirings 122 shown in FIGS. 14-16 has a spiral shape. This connection wiring 122 having a "spiral shape" has a resistance to bending more than the connection wiring 122 having another shape has.

Figure 17:
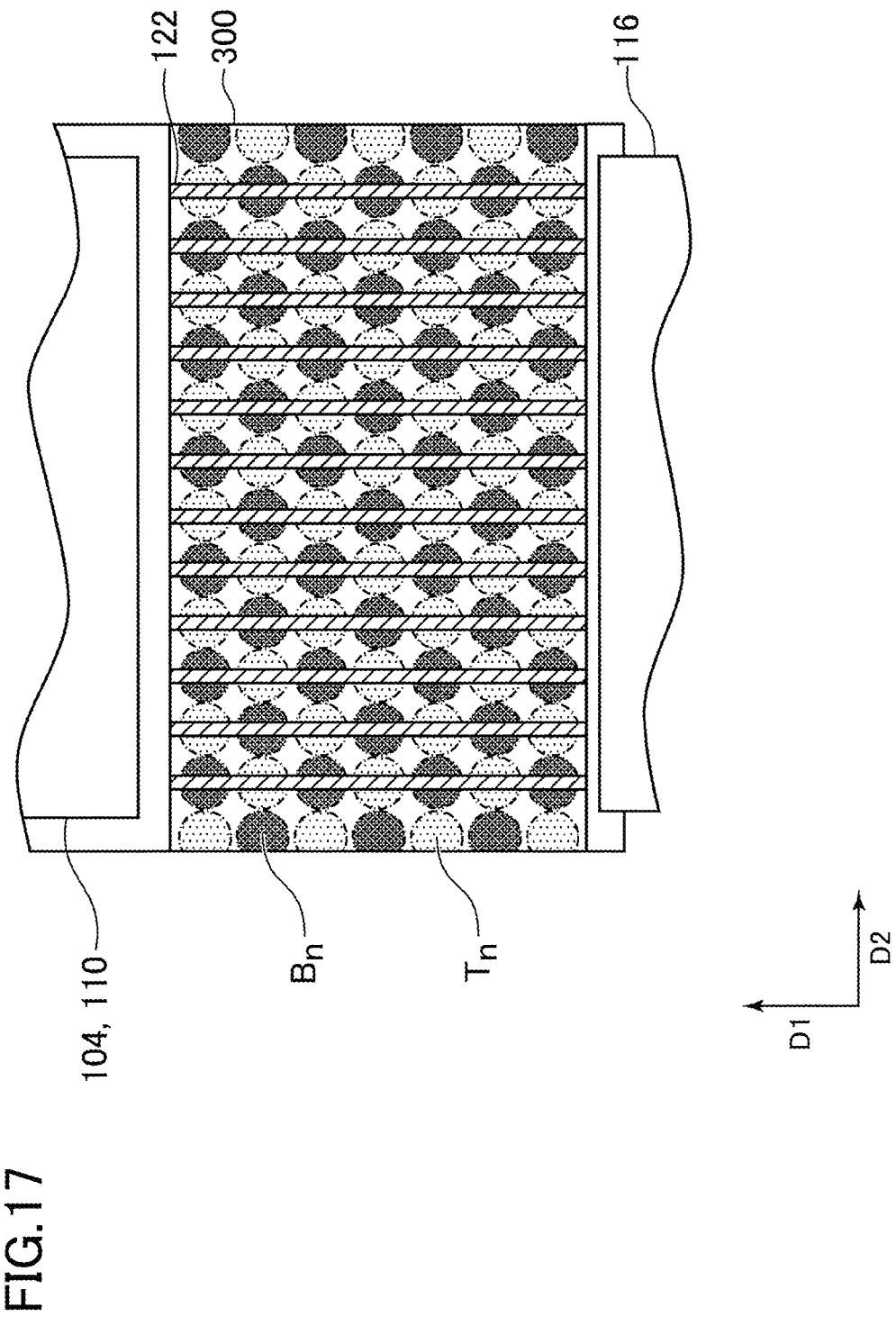
FIG. 17 is a schematic plan view which illustrates a structure of a bendable area of a variation of the second embodiment of the present invention.
Figure 18:
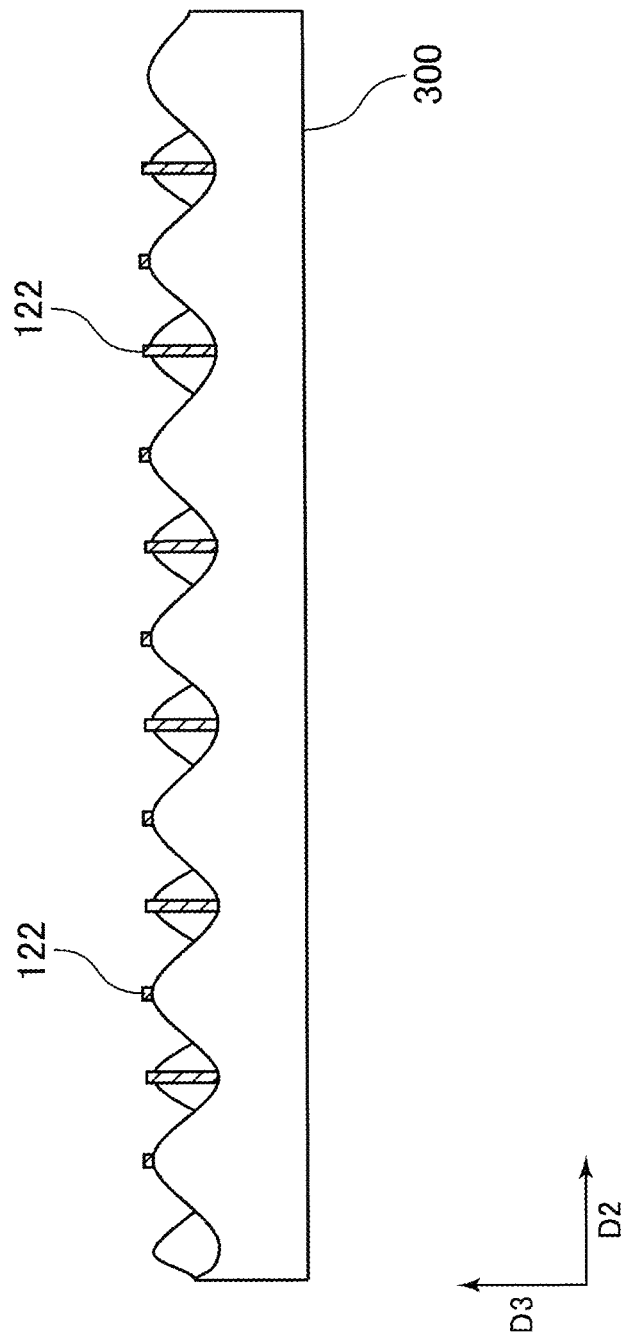
FIG. 18 is a schematic front view which illustrates the structure of the bendable area of the variation of the second embodiment of the present invention.

FIG. 17 is a schematic plan view which illustrates the structure of the bendable area 118 of a variation of the second embodiment. FIG. 18 is a schematic front view which illustrates the structure of the bendable area 118 shown in FIG. 17. In FIGS. 17 and 18, the shape of the connection wiring 122 provided on the under layer 300 is linear. Note that although in FIG. 18, the connection wiring 122 is provided to extend over the trough planes of the under layer 300 or the crestal planes of the under layer 300, but the configuration of the present invention is not limited to this. The connection wiring 122 may be provided to extend over a rim of the crest shape or a rim of the trough shape.

FIG. 19 is an enlarged view which illustrates the structure of the bendable area 118 according to an embodiment of the present invention. Here, the enlarged configuration of one connection wiring 122 is shown. The arrow in FIG. 19 indicates the bending direction of the bendable area 118. As in the first and second embodiments as described above, it is configured that the top parts of the connection wiring 122 do not overlap with parts B having the trough shapes of the under layer 300 or parts T having the crest shapes of the under layer 300.

FIG. 20 is an enlarged view which illustrates the structure of the bendable area 118 according to an embodiment of the present invention. Note that as FIG. 19, FIG. 20 also shows the enlarged configuration of one connection wiring 122. Further, the arrow in FIG. 20 also indicates, as the arrow in FIG. 19, the bending direction of the bendable area 118. In FIG. 20, unlike in the case of FIG. 19, it is configured that the top parts of the connection wiring 122 overlap with parts B having the trough shapes of the under layer 300 or parts T having the crest shapes of the under layer 300.

Note that in FIG. 19, the first inorganic insulating film 208 inside the bendable area 118 is formed so as to fit to the uneven shape which the upper surface of the under layer 300 and the connection wiring 122 have. On the other hand, in FIG. 20, the first inorganic insulating film 208 in the bendable area 118 is formed so as to planarize the uneven shape which the upper surface of the under layer 300 and the connection wiring 122 have. In other words, the configuration of the first inorganic insulating film 208 as described above can be determined by choosing one from the two configurations as described above, regardless of the uneven shape which the upper surface of the under layer 300 has.

By having such a configuration, an area necessary to have a connection wiring in a plan view can be decreased, while having a desired resistance against the bending of the connection wiring.

As to the present embodiment, we illustrated the organic EL display device as an example to be disclosed. Whereas, as another application example, any flat panel display device, such as a liquid crystal display device, another light emitting display device, and an electronic paper display device which has electrophoretic elements, can be mentioned. Further, it is needless to say that the present invention can be applied to a display device ranging from a middle-small type display device to a large type display device, with no limitation.

The various modifications and adjustments to the embodiments will be readily apparent to those skilled in the art, and it is to be understood that these modifications and adjustments are included in the scope of the present invention. For example, the addition or deletion of a constituent element, a change in design, the addition or omission of a process, or a change in conditions which is appropriately performed by a person skilled in art with respect to each of the above described embodiments is also included in the scope of the invention when including the gist of the invention.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising:
   a display area provided with a pixel array part;
   a terminal area arranged on a backside of the display area and provided with a connection terminal to which a signal is supplied from outside; and
   a bendable area to connect the display area and the terminal area, wherein
   the display device is provided with, in the bendable area,
   an under layer having flexibility, and
   a connection wiring which is provided on the under layer and extends from a side of the pixel array part to a side of the connection terminal, and
   an upper surface of the under layer has an uneven shape so that the connection wiring repeatedly turns in directions of a thickness of the under layer.

2. The display device according to claim 1, wherein the uneven shape is a wedge shape.

3. The display device according to claim 1, wherein the uneven shape is a wave shape.

4. The display device according to claim 1, wherein the connection wiring is formed to be non-linear in a plan view.

5. The display device according to claim 4, wherein parts of the connection wiring which are parallel to a bending direction are formed to extend over crest parts and trough parts which the uneven shape has.

6. The display device according to claim 4, wherein parts of the connection wiring which are parallel to a bending direction are formed to at least not extend over crest parts and trough parts which the uneven shape has.

7. The display device according to claim 6, wherein the parts of the connection wiring which are parallel to the bending direction are formed to extend over a plane between crest parts and trough parts which the uneven shape has.

8. The display device according to claim 1, wherein the connection wiring is formed to be linear in a plan view.

9. The display device according to claim 1, wherein a covering layer which has flexibility and which sandwiches the connection wiring with the under layer is provided on the bendable area.

10. The display device according to claim 1, wherein an upper surface of the covering layer has a uneven shape similar to the uneven shape which the upper surface of the under layer has.

11. The display device according to claim 1, wherein an upper surface of the covering layer is planarized regardless of the uneven shape which the upper surface of the under layer has.

12. The display device according to claim 1, wherein the connection wiring is electrically connected to the terminal area and an adjacent area which are outside the display area.

* * * * *